United States Patent
Sun et al.

(10) Patent No.: US 8,253,380 B2
(45) Date of Patent: Aug. 28, 2012

(54) CHARACTERISTIC TRACKING METHOD AND CIRCUIT FOR A BATTERY MODULE

(75) Inventors: Chein-Chung Sun, Kaohsiung (TW); Yuh-Fwu Chou, Jubei (TW); Ming-Wang Cheng, Taoyuan County (TW); Sheng-Yong Shen, Taoyuan County (TW)

(73) Assignee: Industrial Technology Research Institute (TW)

( * ) Notice: Subject to any disclaimer, the term of this patent is extended or adjusted under 35 U.S.C. 154(b) by 547 days.

(21) Appl. No.: 12/497,388

(22) Filed: Jul. 2, 2009

(65) Prior Publication Data

US 2010/0072948 A1 Mar. 25, 2010

(30) Foreign Application Priority Data

Sep. 23, 2008 (TW) .............................. 97136433 A

(51) Int. Cl.
*H02J 7/00* (2006.01)
*H02J 7/16* (2006.01)
*H02J 7/04* (2006.01)

(52) U.S. Cl. ........ 320/128; 320/132; 320/136; 320/152; 320/157; 320/162

(58) Field of Classification Search .................. 320/128
See application file for complete search history.

(56) References Cited

U.S. PATENT DOCUMENTS

| | | | |
|---|---|---|---|
| 5,561,362 A * | 10/1996 | Kawamura et al. | 320/134 |
| 5,847,566 A | 12/1998 | Marritt et al. | |
| 6,104,166 A | 8/2000 | Kikuchi et al. | |
| 6,339,315 B1 | 1/2002 | Castelli et al. | |
| 6,366,054 B1 | 4/2002 | Hoenig et al. | |
| 7,570,021 B2 * | 8/2009 | Togashi et al. | 320/130 |
| 2002/0117997 A1 | 8/2002 | Feil et al. | |
| 2004/0128089 A1 | 7/2004 | Barsoukov et al. | |
| 2005/0073315 A1 * | 4/2005 | Murakami et al. | 324/433 |
| 2008/0074082 A1 * | 3/2008 | Tae et al. | 320/136 |
| 2008/0255783 A1 * | 10/2008 | Tamai | 702/63 |

FOREIGN PATENT DOCUMENTS

CN  1132356  10/1996

OTHER PUBLICATIONS

Office Action dated Sep. 22, 2011 from corresponding Chinese Application No. 200910000551.7.

* cited by examiner

*Primary Examiner* — Edward Tso
*Assistant Examiner* — Ahmed Omar
(74) *Attorney, Agent, or Firm* — Lowe Hauptman Ham & Berner, LLP

(57) ABSTRACT

A characteristic tracking method for a battery module including at least one battery is disclosed. A look-up table is provided according to a primary characteristic of the battery. It is determined whether a battery has satisfied a preset condition when the battery module is operated from a usage state to an idling state. The battery is measured to have obtained a first voltage and a real capacity when the battery satisfies the preset condition. The measured first voltage is utilized to locate a table capacity of the battery from the look-up table. The look-up table is updated according to the real capacity and the table capacity. A peripheral circuit of characteristic tracking method has been exhibited.

36 Claims, 6 Drawing Sheets

CHARACTERISTIC TRACKING METHOD AND CIRCUIT FOR A BATTERY MODULE

CROSS REFERENCE TO RELATED APPLICATIONS

This Application claims priority of Taiwan Patent Application No. 097136433, filed on Sep. 23, 2008, the entirety of which is incorporated by reference herein.

BACKGROUND OF THE INVENTION

1. Field of the Invention

The invention relates to a characteristic tracking method, and more particularly to a characteristic tracking method for tracking characteristics of a battery.

2. Description of the Related Art

Driven by technological development, electronic product trends continue to push the envelope for lighter weights, thinner profiles and smaller volumes. Meanwhile, advanced electronic products frequently utilize rechargeable batteries as a power source. For example, mobile electronic products, such as mobile phones or electromobiles, require rechargeable batteries to obtain power. As such, for normal operation of electronic products, an efficient charging method and system for rechargeable batteries must be implemented before the power of a rechargeable battery is exhausted.

A conventional battery management system (BMS) for rechargeable batteries is to display the power of the rechargeable battery such that a user immediately charges the rechargeable battery before the power of the rechargeable battery is exhausted. However, the storage amount of power in rechargeable batteries is reduced in correspondence with the amount of times a rechargeable battery is charged or discharged. For example, for brand new rechargeable batteries, the effective storage amount of power may be 100%, while for older rechargeable batteries the effective storage amount of power may be as low as 50%. Thus, since the conventional BMS for rechargeable batteries does not correctly adjust for decreased effective storage amount of power when displaying the power of rechargeable batteries. In another words, the displayed power of a rechargeable battery is often mismatch the real storage amount of power.

BRIEF SUMMARY OF THE INVENTION

A characteristic tracking method and circuit for a battery module are provided. An exemplary embodiment of a characteristic tracking method for a battery module comprising at least one battery is described in the following. A look-up table is provided according to a primary characteristic of the battery. It is determined whether a battery has satisfied a preset condition when the battery module is operated from a usage state to an idling state. The battery is measured to have obtained a first voltage and a real capacity when the battery satisfies the preset condition. The measured first voltage is utilized to locate a table capacity of the battery from the look-up table. The look-up table is updated according to the real capacity and the table capacity.

An exemplary embodiment of a characteristic tracking circuit for a battery module comprising at least one battery comprises a current accumulation circuit, a voltage measurement circuit, and a control circuit. The current accumulation circuit obtains a real capacity according to usage of the battery module. The voltage measurement circuit measures the battery to obtain a first voltage. The control circuit utilizes the measured first voltage to locate a table capacity of the battery in a look-up table and updates the look-up table according to the real capacity and the table capacity. The control circuit comprises a determining module. The determining module determines whether a preset condition has been satisfied. When the preset condition has been satisfied the determining module activates the voltage measurement circuit to measure a present open circuit voltage of the battery. The present open circuit voltage serves as the measured first voltage.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
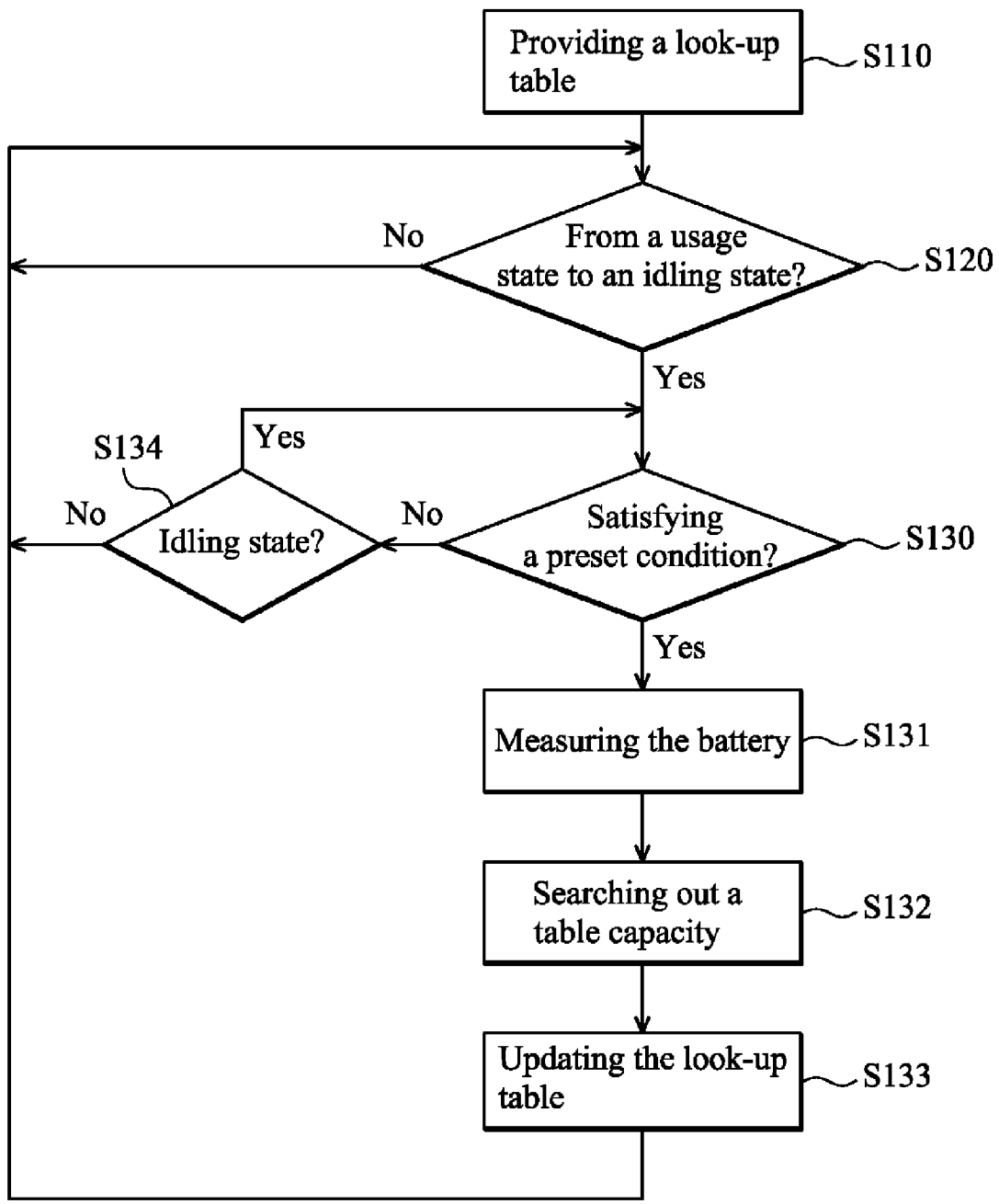
FIG. 1 is a flowchart of an exemplary embodiment of a characteristic tracking method.

FIG. 1 is a flowchart of an exemplary embodiment of a characteristic tracking method. The tracking method can be applied to track a charge or a discharge characteristic for a battery. The characteristic tracking method shown in FIG. 1 tracks a battery module. The battery module comprises at least one battery. For clarity, one battery is given as an example, but the disclosure is not limited thereto.

Figure 2:
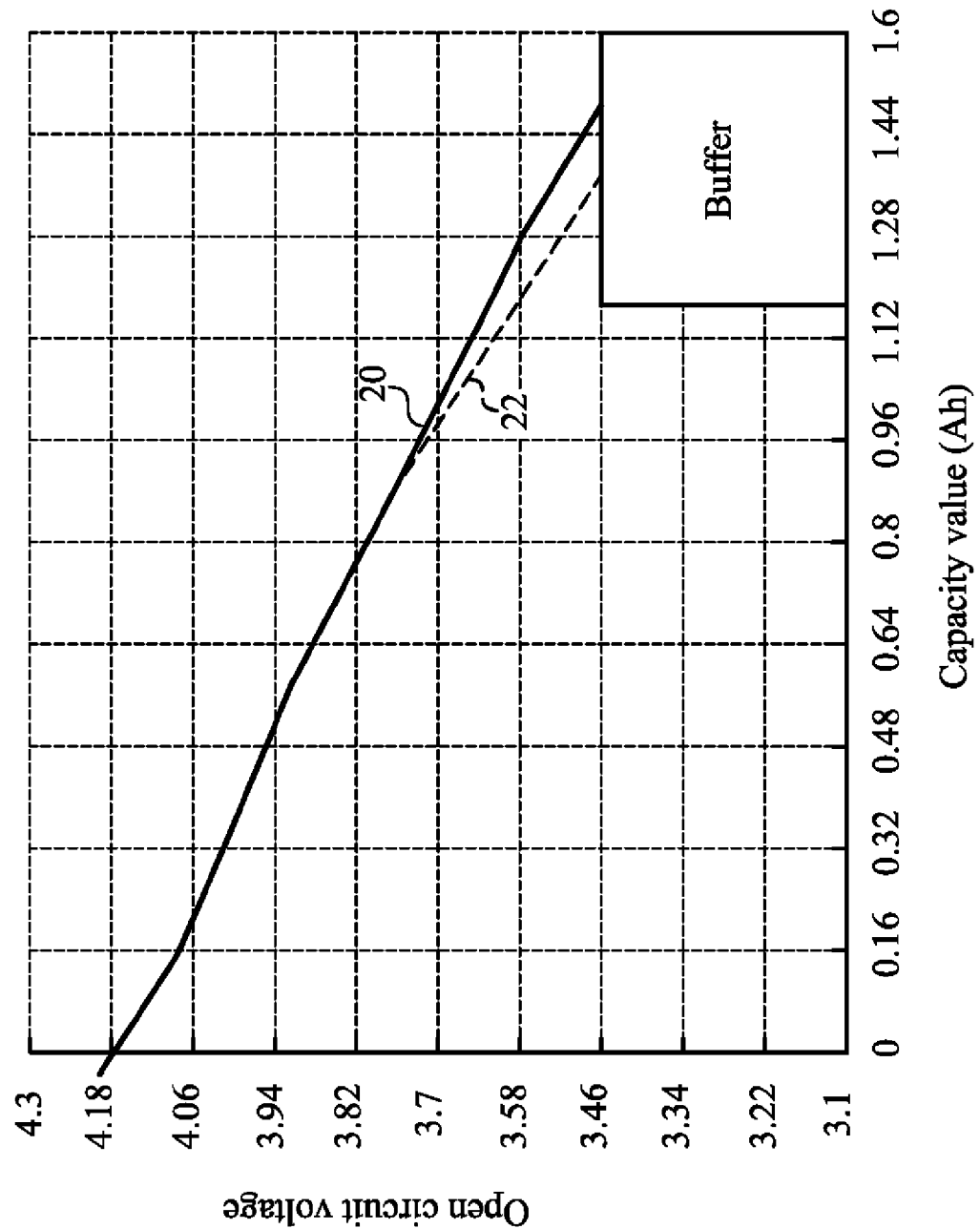
FIG. 2 shows a curve corresponding to a look-up table.

First, a look-up table is provided according to primary characteristics of the battery (step S110). The look-up table is the relationship between open circuit voltage and the energy capacity of battery (FIG. 2). To establish a look-up table, practical requirements are defined to utilize a discharge cutoff state as a based point (empty of battery capacity). A battery is charged and charged capacity of the battery is measured, wherein the look-up table represents different charged capacity of the battery. In other embodiments, a charge cutoff state serves as a based point (fully of battery capacity) to provide another look-up table. In this case, the battery is discharged and discharged capacity is measured, wherein the other look-up table represents different discharged capacity of the battery.

If the discharge cutoff state serves as a based point, the look-up table can be represented as a monotonically increasing curve. Similarly, the look-up table can be regarded as a monotonically decreasing curve if the charge cutoff state serves as a based point, which is shown in FIG. 2. In some embodiments, the discharge cutoff state and the charge cutoff state may serve as two based points for establishing two look-up tables and the characteristic tracking method may be utilized to continuously monitor and update the characteristics of the battery.

In addition, when the usage state of the battery is a discharge state, the look-up table is utilized to provide a charge cutoff point, which serves as a discharge based point (i.e. a start point). Therefore, discharge characteristics of the battery can be obtained from the look-up table. Similarly, when the usage state of the battery is a charge state, the look-up table is utilized to provide a discharge cutoff point, which serves as a charge based point. Therefore, charge characteristic of the battery can be obtained from the look-up table.

In one embodiment, when the battery is discharged and measured, the discharge capacity values are obtained, wherein each discharge capacity value corresponds to one open circuit voltage. A look-up table can be obtained according to different discharge capacity values and the corresponding open circuit voltages. The look-up table relates to a primary characteristic of the battery. For example, after measuring the battery, a plurality of open circuit voltages and a plurality of capacity values are obtained. Each open circuit voltage corresponds to one corresponding capacity value. The unit of each capacity value is ampere-hour (Ah) or watt-hour (Wh). FIG. 2 is a curve schematic corresponding to a look-up table. As shown in FIG. 2, the look-up table represents consumption capacity values, wherein each corresponds to one open circuit voltage. For example, when the open circuit voltage of the battery is 3.75V, the corresponding consumption capacity value is about 0.9 Ah.

Next, it is detected and determined whether the battery has been operated from a usage state to an idling state (step S120). The usage state may be a charge state or a discharge state. If the battery is continuously operated in the usage state, the step S120 is continuously executed. When the battery leaves the usage state, it is detected whether a preset condition has been satisfied (step S130). In this embodiment, the step S130 detects whether the idling time of the battery has exceeded a setting value (e.g. half an hour). In another embodiment, the step S130 detects whether a variation of the open circuit voltages is less than a preset value. In some embodiments, the preset condition relates to the environment temperature of the battery and the idling time of the battery. In this case, when the environment temperature of the battery is higher than a first temperature, the idling time of the battery is detected and it is determined whether the idling time of the battery has exceeded a first setting value. When the environment temperature of the battery is lower than a second temperature, the idling time of the battery is detected and it is determined whether the idling time of the battery has exceeded a second setting value. The second setting value is higher than the first setting value. In one embodiment, the first temperature may exceed the second temperature. When the environment temperature of the battery is between the first and the second temperature, the idling time of the battery is detected and it is determined whether the idling time of the battery arrives to a third setting value. In one embodiment, the third setting value is obtained by using interpolation method.

If the preset condition has not been satisfied, it is detected and it is determined whether the battery is still operating in the idling state (step S134). If the battery is not operating in the idling state, the step S120 is executed. If the battery is operating in the idling state, the step S130 is executed.

When the preset condition is satisfied, the battery is measured to have obtained a first voltage and a real capacity (step S131) by using look-up table. In this embodiment, when the preset condition is satisfied, the battery is measured to have obtained a preset open circuit voltage and a corresponding capacity. The preset open circuit voltage serves as the estimated first voltage. The corresponding capacity, which corresponds to the preset open circuit voltage, serves as the real capacity. In one embodiment, a current accumulation circuit is utilized to obtain the real capacity. Furthermore, if the battery module comprises a plurality of batteries, a plurality of first voltages and a plurality of real capacity values are obtained after measuring the batteries. In one embodiment, the maximum first voltage or the minimum first voltage serves as a major first voltage.

The measured first voltage is utilized to locate a table capacity of the battery from the look-up table (step S132). For example, assuming the open circuit voltage (i.e. the measured first voltage) of the battery is 3.75V and the corresponding capacity value (real capacity) of the battery is 0.82 Ah after measuring the battery, referring to FIG. 2, when the open circuit voltage is 3.75V, the corresponding table capacity is approximately 0.9 Ah.

The look-up table is updated according to the real capacity and the table capacity (step S133). In one embodiment, at least one capacity of the look-up table is changed according to the real capacity and the table capacity. For example, since the result of subtracting the real capacity (0.82 Ah) from the table capacity (0.9 Ah) is 0.08 Ah (0.9–0.82), the deterioration capacity of the battery is 8.88% (0.08/0.9).

All capacity values in the look-up table are updated or only one capacity in the look-up table is updated for the embodiments of the invention. In other embodiments, a portion of capacity values in the look-up table are updated. For example, referring to FIG. 2, when the open circuit voltage of the battery is 3.46V, the table capacity value (i.e. Full Charge Capacity; FCC) is 1.5 Ah. Since the deterioration capacity of the battery is 8.88%, the FCC is changed from 1.5 Ah to 1.367 Ah (1.5−1.5*0.088).

In another embodiment, the measured first voltage obtained by the step S131 can be utilized to define a primary open circuit voltage among the open circuit voltages as shown in the y-axis of FIG. 2. Some capacity values as shown in the x-axis of FIG. 2 are updated. Each updated capacity value corresponds to one open circuit voltage, which is less than the primary open circuit voltage. For example, referring to FIG. 2, the primary open circuit voltage is 3.7V. Thus, the capacity values corresponding to the open circuit voltages 3.7V, 3.58V, and 3.46V are updated.

In this case, the capacity corresponding to the open circuit voltage (e.g. 3.7V) is updated from 0.98 Ah to 0.893 Ah (0.98*0.82/0.9). The capacity corresponding to the open circuit voltage (e.g. 3.58V) is updated from 1.28 Ah to 1.166 Ah (1.28*0.82/0.9). The capacity corresponding to the open circuit voltage (e.g. 3.46V) is updated from 1.5 Ah to 1.367 Ah (1.5*0.82/0.9). Referring to FIG. 2, the updated capacity values constitute the curve 22, which represents an updated look-up table. The curve 20 represents an original look-up table.

In this embodiment, since result of subtracting the real capacity (e.g. 0.82 Ah) from the table capacity (e.g. 0.9 Ah) is positive, a portion of capacity values in the look-up table are updated according to the difference between the real capacity and the table capacity. One updated capacity corresponds to the primary open circuit voltage (e.g. 3.7V) and the other updated capacity values correspond to some open circuit voltages, which are less than the primary open circuit voltage. In other embodiments, when the result of subtracting the real capacity from the table capacity is negative, a compensation method is utilized to update a first capacity, a second capacity, and a third capacity according to the difference between the real capacity and the table capacity. In this case, the first capacity corresponds to a first open circuit voltage. The second capacity corresponds to the primary open circuit voltage. The third capacity corresponds to a second open circuit voltage. The first open circuit voltage, the primary open circuit voltage, and the second open circuit voltage are sequential. For example, if the result of subtracting the real capacity from the table capacity is negative, the capacity values corresponding to the open circuit voltages (e.g. 3.82V, 3.7V, and 3.58V) are updated. In one embodiment, the capacity values corresponding to some specific open circuit voltages are updated according to Gaussian functions or a normal distribution function, which may be illustrated and resembles mountains and hills shape.

In another embodiment, the battery is measured to have obtained a primary capacity before the step S120. In this case, the look-up table is updated according to the real capacity, the table capacity, and the primary capacity. In other embodiments, an aged state of the battery is displayed according to the updated look-up table.

As shown in FIG. 2, the primary open circuit voltage is 4.19V. In some embodiments, if the battery is over charged, the primary open circuit voltage may exceed the maximum open circuit voltage of the look-up table. In other words, the open circuit voltage of the battery may exceed the maximum open circuit voltage 4.19V. Thus, the measuring results may be shifted due to the difference between the real open circuit voltage and the table open circuit voltage. Hence, an algorithm is utilized to obtain the extra capacity. To accurately obtain the real capacity, an extra capacity is required to be deducted from the real capacity when calculating the deterioration capacity. For example, assuming that the primary open circuit voltage of the battery is 4.263V. After the battery has started operating in a usage state, the battery is measured to have an open circuit voltage of 3.94V and a real capacity of 0.46 Ah. Since the real primary open circuit voltage is 4.263V and the table primary open circuit voltage is 4.19V, the extra capacity is 0.1 Ah (0.46*(4.26–4.19)/(4.26–3.94)) by using interpolation. Thus, the extra capacity is required to be deducted from the real capacity of the battery to obtain the real deterioration capacity when updating the look-up table.

For example, assuming that the extra capacity is omitted. The capacity, which was recorded in the look-up table and corresponds to an open circuit voltage (e.g. 3.7V), is updated from 0.98 Ah to 0.893 Ah (0.98*0.82/0.9). When the extra capacity is not omitted, the capacity corresponding to the open circuit voltage (e.g. 3.7V) is updated from 0.893 Ah to 0.793 Ah (0.893–0.1). Similarly, when the extra capacity is omitted, the capacity, recorded in the look-up table and corresponding to another open circuit voltage (e.g. 3.58V) is updated from 1.28 Ah to 1.166 Ah (1.28*0.82/0.9). When the extra capacity is not omitted, the capacity corresponding to the open circuit voltage (e.g. 3.58V), is updated from 1.166 Ah to 1.066 Ah. Similarly, when the extra capacity is omitted, the capacity corresponding to the open circuit voltage (e.g. 3.46V) is updated from 1.5 Ah to 1.367 Ah (1.5*0.82/0.9). When the extra capacity is not omitted, the capacity, recorded in the look-up table and corresponding to another open circuit voltage (e.g. 3.46V), is updated from 1.5 Ah to 1.4 Ah.

Figure 3:
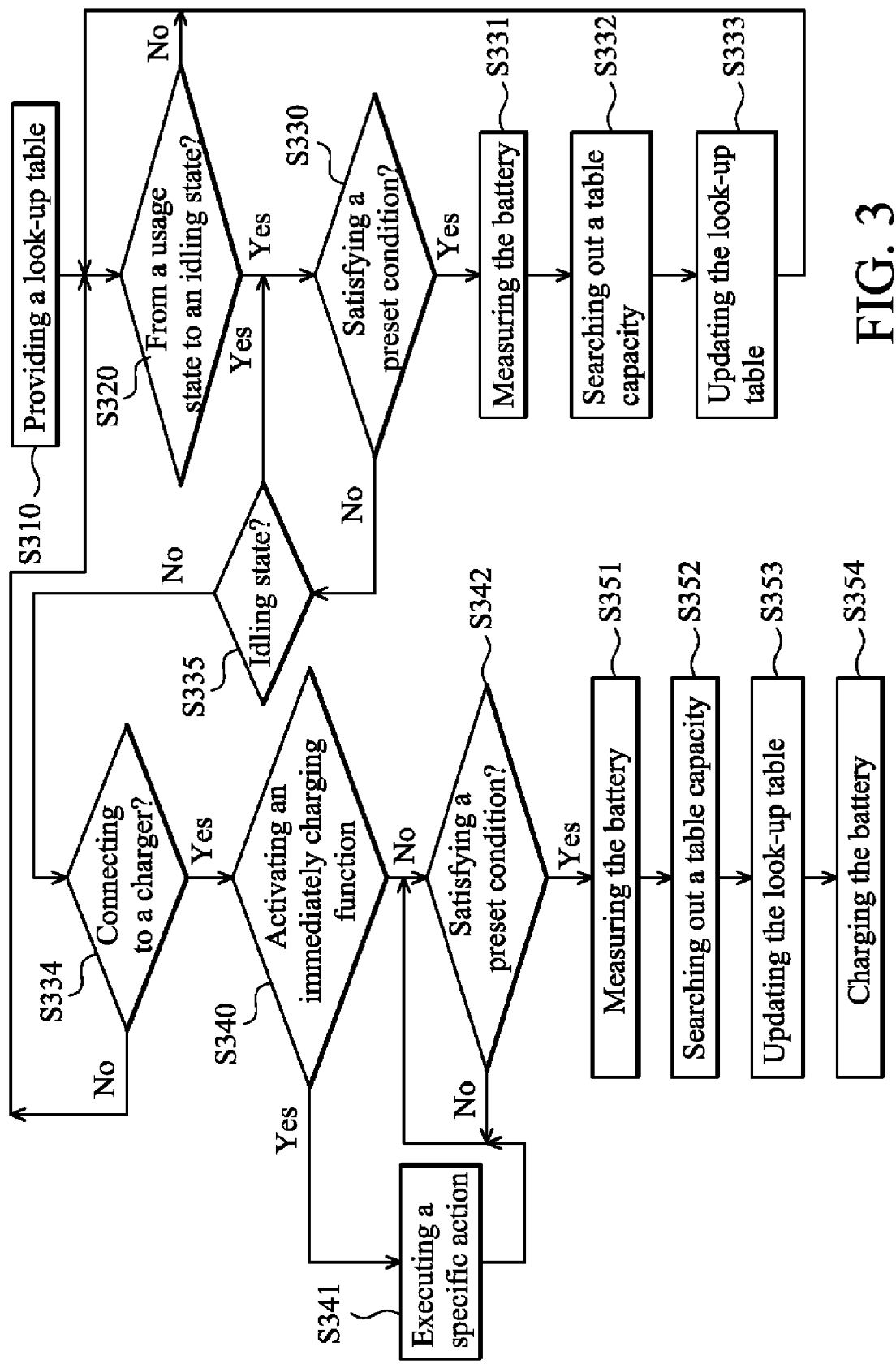
FIG. 3 is a flowchart of another exemplary embodiment of a characteristic tracking method.

FIG. 3 is a flowchart of another exemplary embodiment of the characteristic tracking method. Since FIG. 3 is similar to FIG. 2, the details of the same steps are omitted. First, a look-up table is provided (step S310). The battery is detected and it is determined as to whether the battery has operated from a usage state to an idling state (step S320). When the battery is operating in the idling state, a preset condition is detected and it is determined whether the preset condition is satisfied (step S330). If the preset condition is satisfied, the steps S331~S333 are executed.

If the preset condition is not satisfied, it is detected and it is determined whether the battery is still operating in the idling state (step S335). If the battery is still operating in the idling state, the step S330 is executed. If the battery is not operating in the idling state, the battery is detected and it is determined whether the battery is connected to a charger (step S334). If the battery is not connected to the charger, the step S320 is executed. If the battery is connected to the charger, an immediately charging function is detected and it is determined whether to activate the immediately charging function (step S340). When the immediately charging function is activated, a specific action is executed (step S341). After the step S341, the step S342 is executed.

In one embodiment, the specific action is to obtain a forecasting voltage according to the measured open circuit voltage and its variation. In this case, the look-up table is updated according to the table capacity and a forecasted capacity loss. In another embodiment, the specific action is to intermittently charge the battery while waiting for the preset condition to be satisfied.

If the immediately charging function is de-activated, the preset condition is detected and it is determined whether the preset condition has been satisfied (step S342). If the preset condition has not been satisfied, the step S342 is executed. If the preset condition has been satisfied, the steps S351~S353 are executed. After updating the look-up table (step S353), the battery is charged (step S354).

Figure 4:
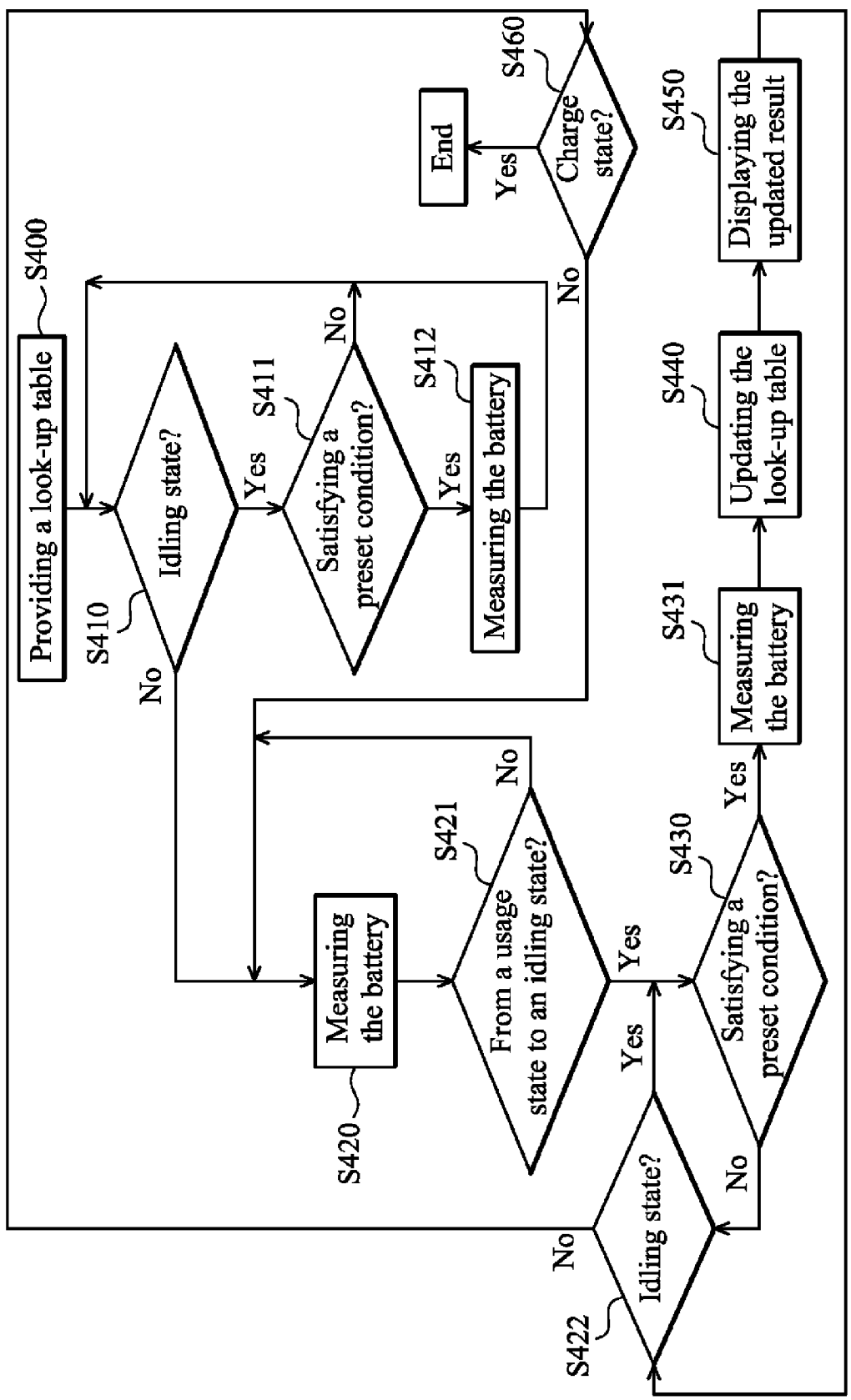
FIG. 4 is a flowchart of another exemplary embodiment of a characteristic tracking method.

FIG. 4 is a flowchart of another exemplary embodiment of the characteristic tracking method. In this embodiment, the look-up table is updated according to a first characteristic, a second characteristic, and a third characteristic. Before using the battery, the characteristic of the battery serves as the first characteristic. During use of the battery, the characteristic of the battery serves as the second characteristic. After use of the battery, the characteristic of the battery serves as the third characteristic.

First, a look-up table is provided (step S400). The battery is detected and it is determined whether the battery is operating in an idling state (step S410). If the battery is operating in the idling state, a preset condition is detected and it is determined whether the preset condition has been satisfied (step S411). In this embodiment, the step S411 detects whether the open circuit voltage of the battery is stable and satisfies the preset value (ex: preset value is defined as 4.0V). When the step S411 is satisfied, the battery is measured to obtain the first specific information (step S412). In this embodiment, the first specific information comprises the open circuit voltages, the consumption capacity values, the environment temperature, and the temperature of the battery. After executing the step S412, the battery is continuously detected and determined as to whether the battery is operating in the idling state (step S410). In one embodiment, when the step S420 is executed, the least measured result generated by the step S412 is served as original information. For example, the last measured open circuit voltage is served as an initial open circuit voltage. Additionally, the initial information generated by the step S412 is reset when the characteristic tracking method is finished and started again. Taking an example which its usage state is determined as discharge mode, the steps S410~S412 are recurring executed when the battery is idling after fully charging and before discharging.

If battery is not operating in the idling state, the battery is measured to obtain the second specific information (step S420). In the embodiment of FIG. 4, the usage state of battery is defined as a discharge state so that the step S420 will be executed while the battery is discharged. Additionally, the second specific information may comprise the consumption capacity values, the environment temperature, and the temperature of the battery.

The battery is detected and it is determined whether the battery has operated from the usage state to the idling state (step S421). If the battery has not operated from the usage state to the idling state, the battery is again measured to update the second specific information (step S420).

When the battery has operated from the usage state to the idling state, a preset condition is detected and it is determined whether the preset condition has been satisfied (step S430). In this embodiment, the preset condition in the step S430 is the same as the preset condition in the step S411. Thus, the preset condition in the step S430 is to detect whether the open circuit voltage of the battery is stable. If the open circuit voltage of the battery is unstable, the battery is detected to determine whether the battery is still operating in the idling state (step S422). While the step S430 is satisfied, the third specific information can be obtained by measuring battery (step S431). In this embodiment, the third specific information includes open circuit voltage, consumption capacity, environment temperature and battery temperature. The look-up table is updated (step S440) and displayed (step S450) according to the first, second and third specific information.

After the step S450, the battery is detected to determine whether the battery is still operating in the idling state (step S422). If the battery is not operating in the idling state, the battery is detected to determine whether the battery is operating in a charge state (step S460). When the battery operates in the charge state, the usage state (i.e. the discharge state) is finished. Thus, the procedure of updating the look-up table is finished. If the battery is not operating in the idling state and the charge state, it indicates that the battery is operating in the discharge state. Thus, the step S420 is executed to update the second specific information.

In one embodiment, the remaining capacity, the consuming capacity, and the aged capacity can be displayed. Furthermore, assuming that the battery comprises a first characteristic before using the battery, the battery comprises a second characteristic during use of the battery, and the battery comprises a third characteristic after use of the battery. The first characteristic is obtained according to the steps S410~S412, the second characteristic is obtained according to the steps S420 and S421, and the third characteristic is obtained according to the steps S430 and S431.

Figure 5:
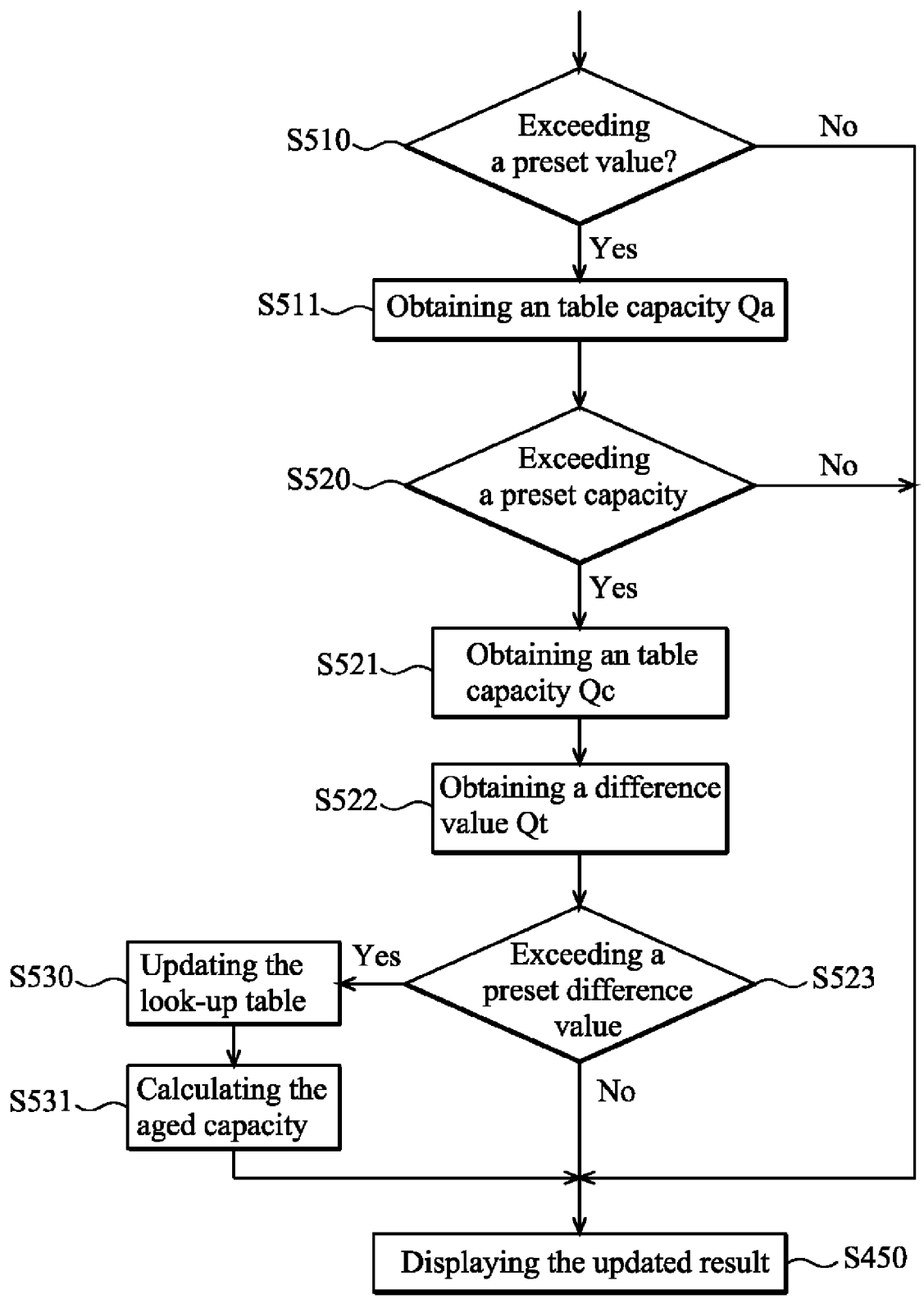
FIG. 5 is an exemplary embodiment of step S440 in FIG. 4.

FIG. 5 is an exemplary embodiment of step S440 in FIG. 4. Assuming that each of the first, the second, and the third information comprises an open circuit voltage and a consumption capacity of the battery. First of all, the open circuit voltage of the first information is detected and it is determined whether the idling time of the battery has exceeded a preset value (step S510). If the open circuit voltage of the first information is less than the preset value, the step S450 is executed. For example, if the open circuit voltage of the first information does not exceed 4.0V, the updating procedure is abandoned.

If the open circuit voltage of the first information exceeds the preset value, a table capacity Qa is located from the look-up table according to the open circuit voltage of the first information (step S511). The consumption capacity Qb of the second specific information is detected and it is determined whether the Qb has exceeded a preset capacity (step S520). If the consumption capacity Qb of the second specific information has not exceeded the preset capacity, the step S450 is executed. Thus, the update procedure is abandoned. For example, if the consumption capacity Qb of the second specific information has not exceeded 15%, the updating procedure is abandoned.

If the consumption capacity Qb of the second specific information exceeds the preset capacity, another table capacity Qc is located from the look-up table according to the open circuit voltage of the third information (step S521). A difference value Qt between the table capacity values Qa and Qc is calculated (step S522). A difference value Qu between the consumption capacity Qb and the difference value Qt is detected and it is determined whether the difference value Qu has exceeded a preset difference value (step S523). If the difference value Qu has not exceeded the preset difference value, the step S450 is executed. For example, if the difference value Qu has not exceeded 5%, the update procedure is abandoned.

If the difference value Qu has exceeded the preset difference value, the capacity values recorded in the look-up table are updated according to the difference value Qu (step S530). In this embodiment, the aged capacity is calculated (step S531) to display the aged capacity. In other embodiments, the step S531 can be omitted.

Figure 6:
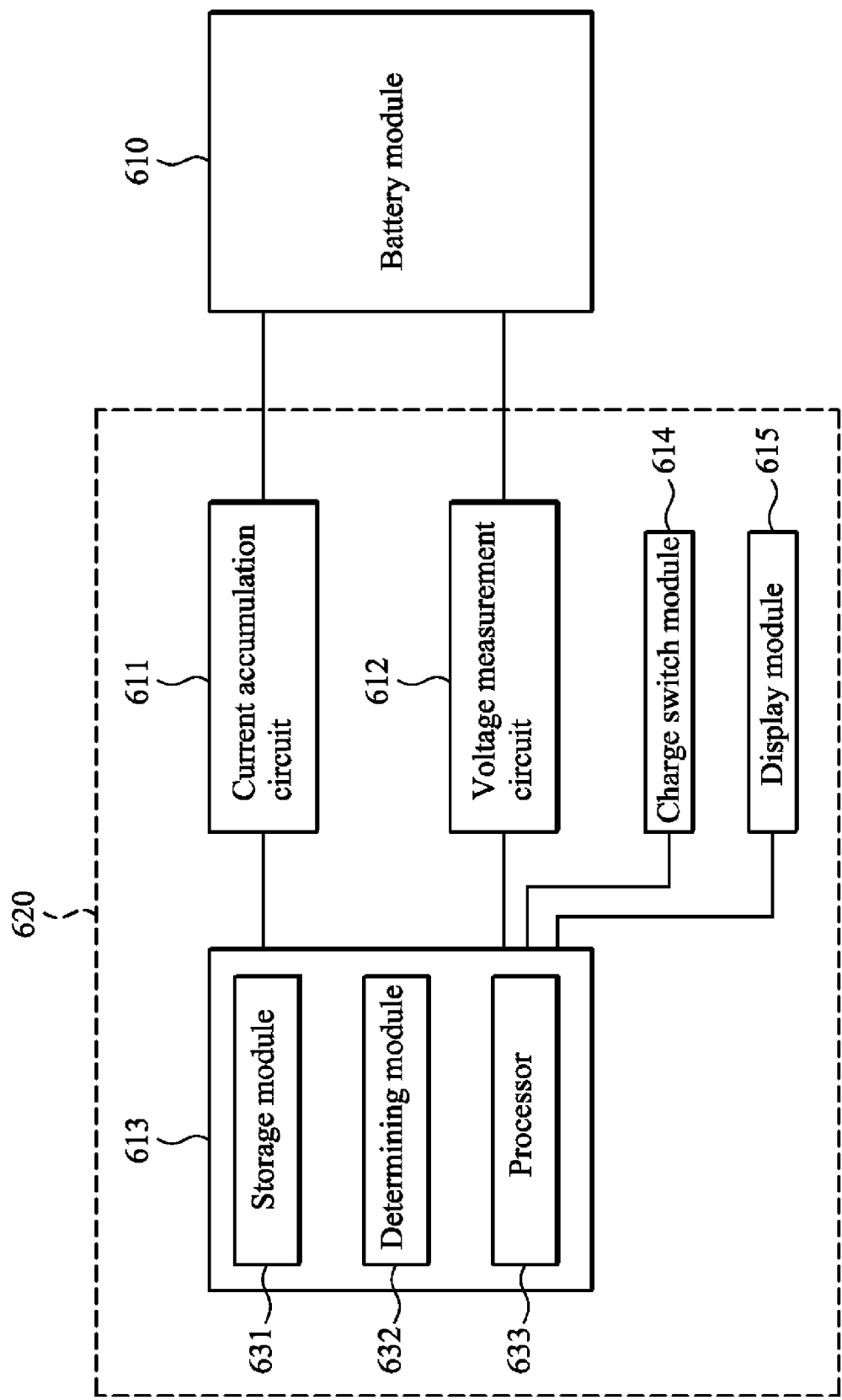
FIG. 6 is a schematic diagram of an exemplary embodiment of a characteristic tracking circuit.

FIG. 6 is a schematic diagram of an exemplary embodiment of a characteristic tracking circuit. The characteristic tracking circuit 620 tracks characteristics of the battery module 610. The battery module 610 comprises at least one battery. In this embodiment, the battery module 610 comprises one battery, but the disclosure is not limited thereto.

The characteristic tracking circuit 620 comprises a current accumulation circuit 611, a voltage measurement circuit 612, and a control circuit 613. The current accumulation circuit 611 obtains a real capacity according to usage of the battery module 610. In another embodiment, the current accumulation circuit 611 defines a primary capacity of the battery before using the battery and then defines a real capacity of the battery after use of the battery.

The voltage measurement circuit 612 measures the battery of the battery module 610 to obtain a first voltage. In this embodiment, the voltage measurement circuit 612 measures the open circuit voltage of the battery. When the voltage measurement circuit 612 measures the battery at different times, the different open circuit voltages can be obtained. Further, if the battery module 610 comprises a plurality of batteries, after the voltage measurement circuit 612 measures the batteries, a plurality of measured first voltages (i.e. open circuit voltages of the batteries) are obtained. In one embodiment, a maximum measured first voltage or a minimum measured first voltage among the measured first voltages serves as an measured result.

The control circuit 613 utilizes the measured result (first voltage) generated by the voltage measurement circuit 612 to locate a table capacity in a look-up table and updates the look-up table according to the real capacity and the table capacity. The real capacity is a processed result provided by the current accumulation circuit 611. After the primary capacity is defined by the current accumulation circuit 611, the control circuit 613 updates the look-up table according to the real capacity, the table capacity, and the primary capacity.

In one embodiment, the control circuit 613 comprises a storage module 631 for storing the look-up table. The look-up table represents a corresponding relationship between the open circuit voltages and the capacity values. Each open circuit voltage corresponds to one corresponding capacity of the battery. The unit of each capacity is ampere-hour (Ah) or watt-hour (Wh). When the battery is charged, if the current accumulation circuit 611 measures the capacity value for each open circuit voltage, the measured capacity values constitute a monotonically increasing curve. The measured capacity values can be stored in the storage module 631. When the battery is discharged, if the current accumulation circuit 611 measures the capacity values for each open circuit voltage, the measured capacity values constitute a monotonically decreasing curve. The measured capacity values can be stored in the storage module 631.

Additionally, the control circuit 613 defines a primary open circuit voltage among the stored open circuit voltages according to the measured result provided by the voltage measurement circuit 612. The stored open circuit voltages are stored in the storage module 631. The control circuit 613 updates a portion of the open circuit voltages according to a difference between the real capacity and the table capacity. Assuming that the open circuit voltages stored in the storage module 631 are 4.18V, 4.06V, 3.94V, 3.82V, 3.7V, 3.58V, and 3.46V. If the present open circuit voltage measured by the voltage measurement circuit 612 is 3.75V, the control circuit 613 defines the stored open circuit voltage 3.75V as a primary open circuit voltage.

In one embodiment, when the result of subtracting the real capacity from the table capacity is positive, the control circuit 613 updates a portion of the capacity values according to the difference between the real capacity and the table capacity. One updated capacity corresponds to the primary open circuit voltage and the other updated capacity values correspond to some open circuit voltages, which are less than the primary open circuit voltage. When the result of subtracting the real capacity from the table capacity is negative, the control circuit 613 utilizes a compensation method to update a first capacity, a second capacity, and a third capacity according to the difference between the real capacity and the table capacity. The first capacity corresponds to a first open circuit voltage. The second capacity corresponds to the primary open circuit voltage. The third capacity corresponds to a second open circuit voltage. The first open circuit voltage, the primary open circuit voltage, and the second open circuit voltage are sequential. In one embodiment, the compensation method is by Gaussian functions or a normal distribution function. The curve of the normal distribution function may be illustrated and resembles mountains and hills shape.

In this embodiment, the control circuit 613 comprises a determining module 632 to determine whether a preset condition has been satisfied. When the preset condition has been satisfied the determining module 632 activates the voltage measurement circuit 612 to measure a present open circuit voltage of the battery to serve as a first voltage. In one embodiment, the determining module 632 is a counter module to detect whether the idling time of the battery has exceeded a setting value. For example, when the idling time of the battery exceeds the setting value, the counter module activates the voltage measurement circuit 612 to measure a present open circuit voltage of the battery. The present open circuit voltage serves as a first voltage.

In another embodiment, the determining module 632 detects a variation of the open circuit voltage of battery. When the variation of the open circuit voltage is less than a preset value, the determining module 632 activates the voltage measurement circuit 612 to measure a present open circuit voltage of the battery. In other embodiments, the determining module 632 is a temperature measurement module to measure an environment temperature of the battery. When the environment temperature of the battery exceeds a first temperature and the idling time of the battery exceeds a first setting value, the temperature measurement circuit activates the voltage measurement circuit 612 to obtain a present open circuit voltage. When the environment temperature of the battery is less than a second temperature and the idling time of the battery exceeds a second setting value, the temperature measurement circuit activates the voltage measurement circuit 612 to obtain another present open circuit voltage. The first temperature is higher than the second temperature. The second setting value is higher than the first setting value.

Additionally, the control circuit 613 comprises a processor 633. After the battery is operating in a discharge state, if the determining module 632 obtains that the preset condition has not been satisfied and the battery is operating in a charge state, the processor 633 determines whether to activate a charge switch module 614 according to an immediately charged signal. The charge switch module 614 provides power to the battery of the battery module 610 when the charge switch module 614 is activated. Thus, a charge action is executed.

When the immediately charged signal is de-activated, after the preset condition is satisfied and the processor updates the look-up table, the processor 633 activates the charge switch module 614 for charging the battery. When the immediately charged signal is activated, the processor 633 obtains a forecasted voltage according to a variation of the open circuit voltage and utilizes the forecasted voltage to locate the table capacity of the battery from the look-up table. In another embodiment, when the immediately charged signal is activated, the processor 633 controls the charge switch module 614 to intermittently charge the battery while waiting for the preset condition to be satisfied.

The characteristic tracking circuit 620 further comprises a display module 615 for displaying a tracking result. In one embodiment, the display module 615 is capable of displaying an effective remaining capacity, an ineffective capacity, a consuming capacity, and the aged capacity.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A characteristic tracking method for a battery module comprising at least one battery, comprising:
   providing a look-up table according to a primary characteristic of the battery;
   detecting whether the battery satisfies a preset condition when the battery module is operated from a usage state to an idling state;
   measuring a first voltage and a real capacity of the battery when the battery satisfies the preset condition;
   utilizing the measured first voltage to located a table capacity of the battery from the look-up table; and
   updating the look-up table according to the real capacity and the table capacity,
   wherein when the usage state is a discharge state, the look-up table is utilized to provide a charge cutoff point, which serves as a discharge based point such that discharge characteristics of the battery can be obtained from the look-up table, and
   wherein when the usage state is a charge state, the look-up table is utilized to provide a discharge cutoff point which serves as a charge based point such that charge characteristics of the battery can be obtained from the look-up table.

2. The characteristic tracking method as claimed in claim 1, further comprising:
   before the usage state, measuring a primary capacity of the battery, wherein the look-up table is updated according to the real capacity, the table capacity, and the primary capacity.

3. The characteristic tracking method as claimed in claim 1, wherein a plurality of open circuit voltages are measured in the measuring step, and each open circuit voltage corresponds to one battery capacity, and wherein the look-up table represents a relationship between the open circuit voltages and the capacity values.

4. The characteristic tracking method as claimed in claim 3, wherein the unit of each capacity is ampere-hour (Ah) or watt-hour (Wh).

5. The characteristic tracking method as claimed in claim 3, wherein a primary open circuit voltage among the open circuit voltages is defined according to the measured first voltage and a portion of capacity values are updated according to the difference between the real capacity and the table capacity.

6. The characteristic tracking method as claimed in claim 5, wherein:
   when the result of subtracting the real capacity from the table capacity is positive, a portion of the capacity values are updated according to the difference between the real capacity and the table capacity; and
   one of the updated capacity corresponds to the primary open circuit voltage and the other updated capacity values correspond to a portion of the open circuit voltages less than the primary open circuit voltage.

7. The characteristic tracking method as claimed in claim 5, wherein when the result of subtracting the real capacity from the table capacity is negative, a compensation method and the subtracting result are utilized to update a portion of capacity values in the look-up table, wherein a first updated value among the updated capacity value corresponds the first voltage, a second updated value among the updated capacity value corresponds to a second voltage exceeding the first voltage, a third updated value among the updated capacity value corresponds to a third voltage less than the first voltage, the capacity values in the look-up table and between the first and the second updated capacity values are updated, and the capacity values in the look-up table and between the second and the third updated capacity values are updated.

8. The characteristic tracking method as claimed in claim 7, wherein the compensation method is a normal distribution function.

9. The characteristic tracking method as claimed in claim 1, wherein when the preset condition is satisfied, the battery is measured so that an open circuit voltage may be obtained to serve as the measured first voltage.

10. The characteristic tracking method as claimed in claim 9, wherein the preset condition is the battery in an idle state and the idling time of the battery exceeding a preset value.

11. The characteristic tracking method as claimed in claim 9, wherein a plurality of open circuit voltages are obtained in the measuring step and the preset condition is when a variation of the open circuit voltages is less than a preset value.

12. The characteristic tracking method as claimed in claim 9, wherein the preset condition is the environment temperature of the battery.

13. The characteristic tracking method as claimed in claim 12, wherein:
   when the environment temperature of the battery is higher than a first temperature, the preset condition is the idling time of the battery exceeding a first setting value, wherein:
   when the environment temperature of the battery is lower than a second temperature, the preset condition is the idling time of the battery exceeding a second setting value, wherein:
   when the environment temperature of the battery is between the first and the second temperature, the preset condition is the idling time of the battery exceeding a third setting value;
   the first temperature is higher than the second temperature and the second setting value is higher than the first setting value; and
   the first and the second setting values are calculated by a linear operation to obtain the third setting value.

14. The characteristic tracking method as claimed in claim 9, wherein:
   the usage state is defined as a discharge state; wherein:
   after the battery is operated from the discharge state to the idling state, an immediately charging function is detected and it is determined whether to activate the immediately charging function if the preset condition does not be satisfied and the battery is operated from the idling state to the charge state; and
   if the immediately charging function is not activated, the battery is charged when the preset condition is satisfied and the look-up table is updated.

15. The characteristic tracking method as claimed in claim 9, wherein the usage state is a discharge state, and a plurality of open circuit voltages are obtained in the measuring step, and wherein;
   after the battery is operated from the discharge state to the idling state, if the preset condition is not satisfied and the battery is operated from the idling state to the charge state, an immediately charging function is detected and it is determined whether to activate the immediately charging function;
   if the immediately charging function is activated, a forecasted voltage is obtained according to the variation of the open circuit voltages and the measured first voltage; and
   the table capacity is located according to the forecasted voltage.

16. The characteristic tracking method as claimed in claim 9, wherein the usage state is a discharge state, and wherein;
   after the battery is switched from the discharge state to the idling state, if the preset condition is not satisfied and the battery is operated in the charge state, an immediately charging function is detected and it is determined whether to activate the immediately charging function; and
   if the immediately charging function is activated, the battery is intermittently charged while waiting for the preset condition to be satisfied.

17. The characteristic tracking method as claimed in claim 1, wherein when the battery module comprises a plurality of batteries, a plurality of first voltages and a plurality of first capacity values are obtained after measuring the batteries, and wherein;
   the minimum first voltage and the maximum first voltage among the measured first voltages are utilized to locate the table capacity of the battery from the look-up table.

18. The characteristic tracking method as claimed in claim 1, wherein when the battery is in the usage state, a current accumulated circuit is utilized to obtain real capacity by calculating the coulomb consumption of battery.

19. The characteristic tracking method as claimed in claim 1, further comprising:
   displaying an aged state of the battery according to the updated look-up table.

20. A characteristic tracking circuit for a battery module comprising at least one battery, comprising:

a current accumulation circuit obtaining a real capacity according to usage of the battery module;
a voltage measurement circuit measuring the battery to obtain a first voltage; and
a control circuit utilizing the measured first voltage to locate a table capacity from a look-up table, and updating the look-up table according to the real capacity and the table capacity, comprising:
a determining module determining whether a preset condition has been satisfied, wherein when the preset condition has been satisfied, the determining module activates the voltage measurement circuit to measure a present open circuit voltage of the battery to serve as the measured first voltage,
wherein the look-up table is utilized to provide a discharge cutoff point of the battery to serve as a charge based point and a charge characteristic of the battery is obtained according to the charge based point, and
wherein the look-up table is utilized to provide a charge cutoff point of the battery to serve as a discharge based point and a discharge characteristic of the battery is obtained according to the discharge based point.

21. The characteristic tracking circuit as claimed in claim 20, wherein the current accumulation circuit defines a primary capacity before the battery is operated in the usage state, and the control circuit updates the look-up table according to the real capacity, the table capacity, and the primary capacity.

22. The characteristic tracking circuit as claimed in claim 20, wherein the control circuit comprises a storage module, and wherein:
the look-up table represents a corresponding relation between the open circuit voltages and the capacity values; and
the open circuit voltages and the capacity values are stored in the storage module.

23. The characteristic tracking circuit as claimed in claim 22, wherein the unit of each capacity is ampere-hour (Ah) or watt-hour (Wh).

24. The characteristic tracking circuit as claimed in claim 22, wherein the control circuit defines a primary open circuit voltage among the open circuit voltages according to the measured first voltage, and updates a portion of capacity values of the look-up table according to the difference between the real capacity and the table capacity.

25. The characteristic tracking circuit as claimed in claim 24, wherein:
when the result of subtracting the real capacity from the table capacity is positive, the control circuit updates a portion of the capacity values according to the difference between the real capacity and the table capacity; and
one updated capacity corresponds to the primary open circuit voltage and the other updated capacity values correspond to some open circuit voltages, which are less than the primary open circuit voltage.

26. The characteristic tracking circuit as claimed in claim 24, wherein when the result of subtracting the real capacity from the table capacity is negative, the control circuit utilizes a normal distribution function and the subtracting result to update a portion of capacity values in the look-up table, wherein a first updated value among the updated capacity values corresponds the first voltage, a second updated value among the updated capacity values corresponds to a second voltage exceeding the first voltage, a third updated value among the updated capacity values corresponds to a third voltage less than the first voltage, the capacity values in the look-up table and between the first and the second updated capacity values are updated, and the capacity values in the look-up table and between the second and the third updated capacity values are updated.

27. The characteristic tracking circuit as claimed in claim 24, wherein the determining module is a counter module to determine whether the idling time of the battery has exceeded a setting value, and when the idling time of the battery has exceeded the setting value, the counter module activates the voltage measurement circuit to obtain the present open circuit voltage to serve as the measured first voltage.

28. The characteristic tracking circuit as claimed in claim 24, wherein the voltage measurement circuit measures the battery to obtain a plurality of open circuit voltages, the determining module determines a variation of the open circuit voltages, and when the variation is less than a preset value, the determining module activates the voltage measurement circuit to obtain the present open circuit voltage to serve as the measured first voltage.

29. The characteristic tracking circuit as claimed in claim 20, wherein the determining module is a temperature measurement module to measure an environment temperature of the battery.

30. The characteristic tracking circuit as claimed in claim 29, wherein when the environment temperature of the battery exceeds a first temperature and the idling time of the battery exceeds a first setting value, the temperature measurement circuit activates the voltage measurement circuit to obtain the present open circuit voltage to serve as the measured first voltage, and wherein;
when the environment temperature of the battery is less than a second temperature and the idling time of the battery exceeds a second setting value, the temperature measurement circuit activates the voltage measurement circuit to obtain the present open circuit voltage; and
the first temperature is higher than the second temperature and the second setting value is higher than the first setting value.

31. The characteristic tracking circuit as claimed in claim 20, wherein the control circuit further comprises a processor, wherein;
when the battery is operated from a discharge state to a idling state, if the preset condition has not been satisfied and the battery is operated from the idling state to a charge state, the processor determines whether to activate a charge switch module according to an immediately charged signal; and
the charge switch module provides a power level to the battery when the charge switch module is activated.

32. The characteristic tracking circuit as claimed in claim 31, wherein when the immediately charged signal is de-activated, after the preset condition is satisfied and the processor updates the look-up table, the charge switch module is activated to charge the battery.

33. The characteristic tracking circuit as claimed in claim 31, wherein the voltage measurement circuit measures the battery to obtain a plurality of open circuit voltages; and
when the immediately charged signal is activated, the processor obtains a forecasted voltage according to a variation of the open circuit voltages and the measured first voltage and utilizes the forecasted voltage to locate the table capacity of the battery from the look-up table.

34. The characteristic tracking circuit as claimed in claim 31, wherein when the immediately charged signal is activated, the charge switch module intermittently charges the battery while waiting for the preset condition to be satisfied.

35. The characteristic tracking circuit as claimed in claim 20, wherein when the battery module comprises a plurality of batteries, the voltage measurement circuit measures the batteries to obtain a plurality of first voltages and a plurality of real capacity values, and wherein the control circuit searches out one of the table capacity values according to the minimum first voltage or the maximum first voltage.

36. The characteristic tracking circuit as claimed in claim 20, further comprising a display module for displaying an aged state of the battery.

* * * * *